(12) United States Patent
Lai et al.

(10) Patent No.: US 8,823,129 B2
(45) Date of Patent: Sep. 2, 2014

(54) LATCH-UP PREVENTION STRUCTURE AND METHOD FOR ULTRA-SMALL HIGH VOLTAGE TOLERANT CELL

(75) Inventors: Da-Wei Lai, Hsinchu (TW); Jen-Chou Tseng, Jhudong Township (TW); Chien-Yuan Lee, Zhubei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 608 days.

(21) Appl. No.: 12/797,782

(22) Filed: Jun. 10, 2010

(65) Prior Publication Data

US 2010/0314709 A1 Dec. 16, 2010

Related U.S. Application Data

(60) Provisional application No. 61/186,608, filed on Jun. 12, 2009.

(51) Int. Cl.
  *H01L 27/105* (2006.01)
  *H01L 27/092* (2006.01)
  *H01L 29/06* (2006.01)
  *H01L 27/118* (2006.01)

(52) U.S. Cl.
  CPC ... *H01L 27/0921* (2013.01); *H01L 2027/11892* (2013.01); *H01L 29/0642* (2013.01)

USPC .................. 257/500; 257/372; 257/E27.067

(58) Field of Classification Search
  None
  See application file for complete search history.

(56) References Cited

U.S. PATENT DOCUMENTS 6,593,799 B2 * 7/2003 De et al. .......................... 327/534

* cited by examiner

*Primary Examiner* — Fei Fei Yeung Lopez
(74) *Attorney, Agent, or Firm* — Lowe Hauptman & Ham, LLP

(57) ABSTRACT

A latch-up prevention structure and method for ultra-small high voltage tolerant cell is provided. In one embodiment, the integrated circuit includes an input and/or output pad, a floating high-voltage n-well (HVNW) connected to the input and/or output pad through a P+ in the floating HVNW and also connected to a first voltage supply, a low-voltage n-well (LVNW) connected to a second voltage supply through a N+ in the LVNW, a HVNW control circuit, and a guard-ring HVNW, where the first voltage supply has higher voltage level than the second voltage supply, guard-ring HVNW is inserted in between the floating HVNW and LVNW to prevent a latch-up path between a P+ in HVNW and N+ in LVNW by using the HVNW control circuit that controls the guard-ring HVNW's voltage level. The guard-ring HVNW's voltage level is matched by the floating HVNW's voltage level.

20 Claims, 3 Drawing Sheets

US 8,823,129 B2

LATCH-UP PREVENTION STRUCTURE AND METHOD FOR ULTRA-SMALL HIGH VOLTAGE TOLERANT CELL

CROSS-REFERENCE TO RELATED APPLICATIONS

The present application claims priority of U.S. Provisional Patent Application Ser. No. 61/186,608, filed on Jun. 12, 2009, which is incorporated herein by reference in its entirety.

TECHNICAL FIELD

This disclosure relates generally to a structure and method for latch-up prevention in integrated circuits, more specifically latch-up prevention from high-voltage n-well to low-voltage n-well for ultra-small high voltage tolerant cell.

BACKGROUND

Latch-up is an adverse effect occurring in Complementary Metal-Oxide Semiconductor (CMOS) devices when a significant current flows through a Si substrate between N-type Metal-Oxide Semiconductor device (NMOS) and P-type Metal-Oxide Semiconductor device (PMOS) parts of CMOS structure and degrades its performance. Latch-up occurs when certain bias conditions trigger a parasitic structure of two parasitic bipolar transistors, thus creating an inadvertent low-impedance path between the power supply rails of a Metal-Oxide Semiconductor Field-Effect Transistor (MOSFET) circuit and provide high conductivity path between NMOS and PMOS parts of the device. This disrupts proper functioning of the part and possibly even leading to its destruction due to excessive amount of current. A power cycle is required to correct this situation.

The parasitic structure is usually equivalent to a thyristor or Semiconductor-Controlled Rectifier (SCR), a PNPN structure that acts as a PNP and an NPN transistor stacked next to each other. During a latch-up when one of the transistors is conducting, the other one begins conducting, too. They both keep each other in saturation for as long as the structure is forward-biased and some current flows through it, which usually means that it remains until a power-down.

The latch-up does not have to happen between the power rails; it can happen at any place where the required parasitic structure exists. A spike of positive or negative voltage on an input or output pin of a digital chip, exceeding the rail voltage by more than a diode drop, is a common cause of latch-up. Another cause is the supply voltage exceeding the absolute maximum rating, often from a transient spike in the power supply, leading to a breakdown of some internal junction. This frequently happens in circuits which use multiple supply voltages that do not come up in the proper order after a power-up, leading to voltages on data lines exceeding the input rating of parts that have not yet reached a nominal supply voltage.

Latch-up happening in a parasitic structure from P+ in n-well (high voltage supply n-well, HVNW) connected to a high voltage supply to N+ in n-well (low voltage supply n-well, LVNW) connected to a low voltage supply is worse than in a parasitic structure from P+ in HVNW to N+ in p-well (PW) connected to either high or low voltage, especially in high voltage tolerant (HVT) Input/Output (I/O) library application, e.g. for 2.5 V/3.3 V tolerant to 3.3 V/5.5 V HVT I/O library. It is due to the substrate resistance of N+ in LVNW is larger than N+ in PW, as a result, the $\beta_{npn}$ is larger for N+ in LVNW case. As for HVT I/O library, since it needs to sustain input of high voltage from 3.3 V to 5 V (power supply) in some applications, the voltage difference between HVNW and LVNW is larger than non-HVT I/O library.

One way to avoid the latch-up problem is to enlarge the latch-up path spacing, i.e. the space between P+ in HVNW to N+ in LVNW. For example, using a current trigger testing (a test that injects (+/−) current to I/O pad and evaluates the latch-up behavior), a proper spacing can be determined. In a latch-up current injection testing, an exemplary circuit with the signal I/O pad with HVNW abutting on the low voltage power pad with LVNW cannot pass the test and latch-up occurs between the HVNW and LVNW. However, the circuit could pass the latch-up testing when at least 30 μm spacing was provided in between the HVNW and LVNW by inserting another signal I/O pad between the HVNW (existing signal I/O pad) and LVNW (low voltage power pad).

However, the extra space increases the design area and results in larger area impact by inefficient use of the chip area. This is a problem especially for ultra-small HVT cell designs. Considering that the scale of integrated circuits is constantly shrinking for higher density and more efficient use of the chip area, increased spacing is contrary to the design objective. Further, even after increasing the latch-up path spacing, latch-up can still happen depending on potential extreme conditions, due to the voltage difference between HVNW (e.g. 3.3 V or 5 V) to LVNW (e.g. 1.2 V).

Accordingly, new structure and method for latch-up prevention in integrated circuits, particularly for ultra-small HVT cell are desired.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the invention, and do not limit the scope of the invention.

A latch-up prevention structure and method in integrated circuits is provided. More particularly, the prevention of latch-up from P+ in high voltage n-well (HVNW) to N+ in low voltage n-well (LVNW) is described for ultra-small High Voltage Tolerant (HVT) cells. Using guard-ring HVNW and HVNW control circuits, latch-up is prevented from P+ in HVNW to N+ in LVNW for ultra-small HVT cells. Throughout the various views and illustrative embodiments of the present invention, like reference numbers are used to designate like elements.

Figure 1:
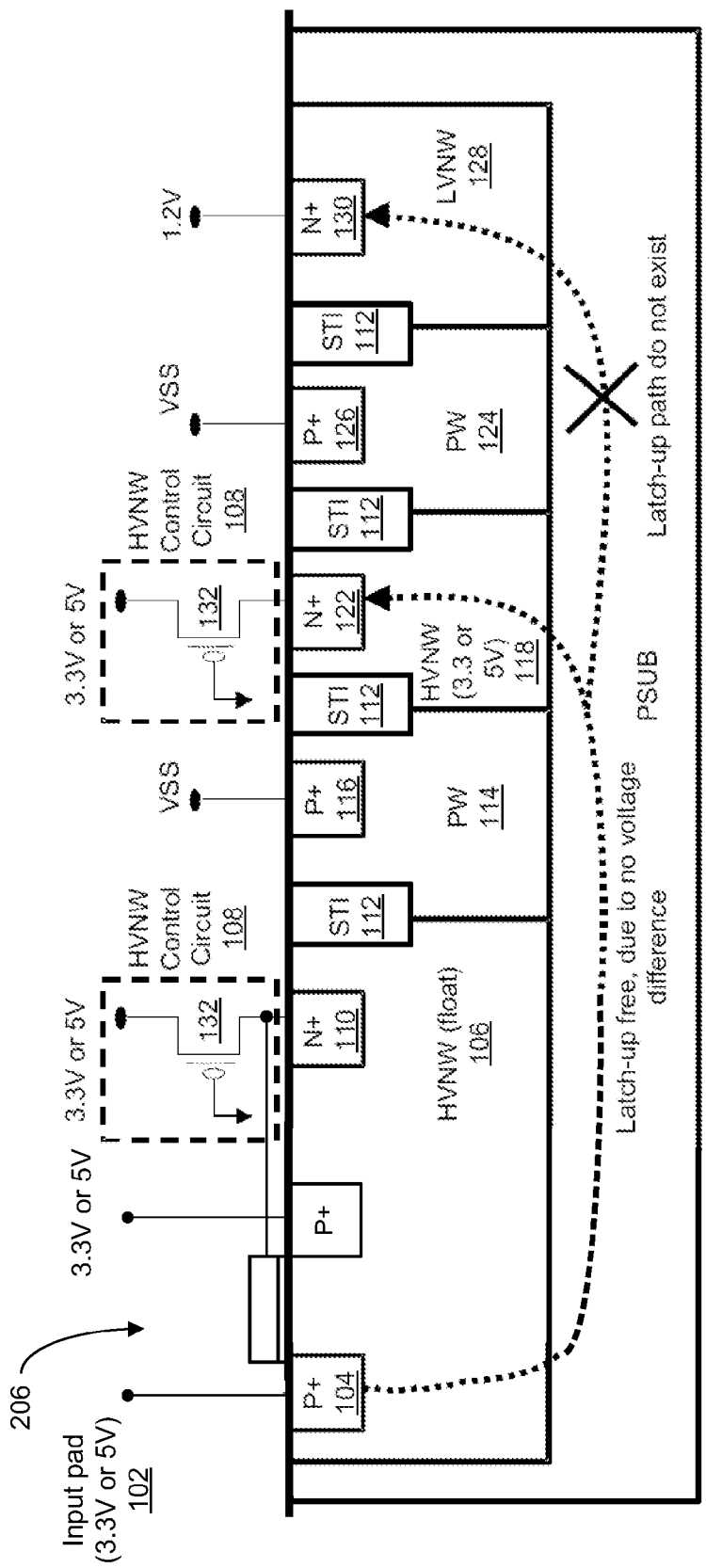
FIG. 1 illustrates an exemplary structure for latch-up prevention according to an embodiment.

FIG. 1 illustrates an exemplary structure for latch-up prevention according to an embodiment. An input (and/or output) pad 102 with a power supply of 3.3V or 5V (VDD) is connected to a P+ 104 in HVNW (floating n-well) 106. The HVNW control circuit 108 is connected to the N+ 110 in the HVNW 106. The PMOS 132 is a HVNW control element in the HVNW control circuit 108. The shallow trench isolation (STI) 112 isolates n-well (NW) and p-well (PW) structures. PW 114 has P+ 116 inside that is connected to VSS and PW 124 has P+ 126 inside that is connected to VSS. LVNW 128 has N+ 130 connected to a low voltage (power supply) 1.2V. To prevent latch-up from HVNW 106 to LVNW 128, HVNW 118 is inserted in between HVNW 106 and LVNW 128. The N+ 122 in the HVNW 118 is connected to the NVNW control circuit 108 (the same circuit that is connected to N+ 110 in HVNW 106). The HVNW 118 forms a guard-ring around the LVNW 128 to prevent any latch-up path from HVNW 106 to LVNW 128.

The HVNW control circuit 108 that is connected to HVNW 118 through N+ 122 controls the voltage level of guard-ring HVNW 118. The main function of HVNW (or floating NW) control circuit 108 is to feed VDD to the bulk and gate of an I/O PMOS driver (206, shown in FIG. 2) where the bulk of I/O PMOS driver is also the floating NW 106, so that there is no leakage from input (and/or output) pad 102 to VDD under normal input mode (0 V~VDD). This HVNW control circuit 108 will feed a voltage greater than VDD to the bulk and gate of the I/O PMOS driver, so that there is no leakage between the input (and/or output) pad 102 to VDD under high voltage tolerant input mode (0 V~>VDD). Therefore, the guard-ring HVNW 118 voltage is matched by I/O pad PMOS driver's bulk (or HVNW 106), which is controlled by HVNW control circuit 108.

For a latch-up to occur, there has to be a voltage drop between P+ 104 in HVNW 106 to N+ 130 in LVNW 128. The voltage of the guard-ring HVNW 118 is matched by I/O pad PMOS driver's bulk (or HVNW 106), which is controlled by HVNW control circuit 108. Therefore, there is no voltage drop from P+ 104 in the HVNW 106 (3.3V or 5V) to N+ 122 in the HVNW 118 (3.3V or 5V). Further, any potential latch-up current from HVNW 106 will first see the guard-ring HVNW 118, so there is no current path formed between P+ 104 in HVNW 106 to N+ 130 in LVNW 128. Thus, the latch-up path does not exist in the structure in FIG. 1.

Figure 2:
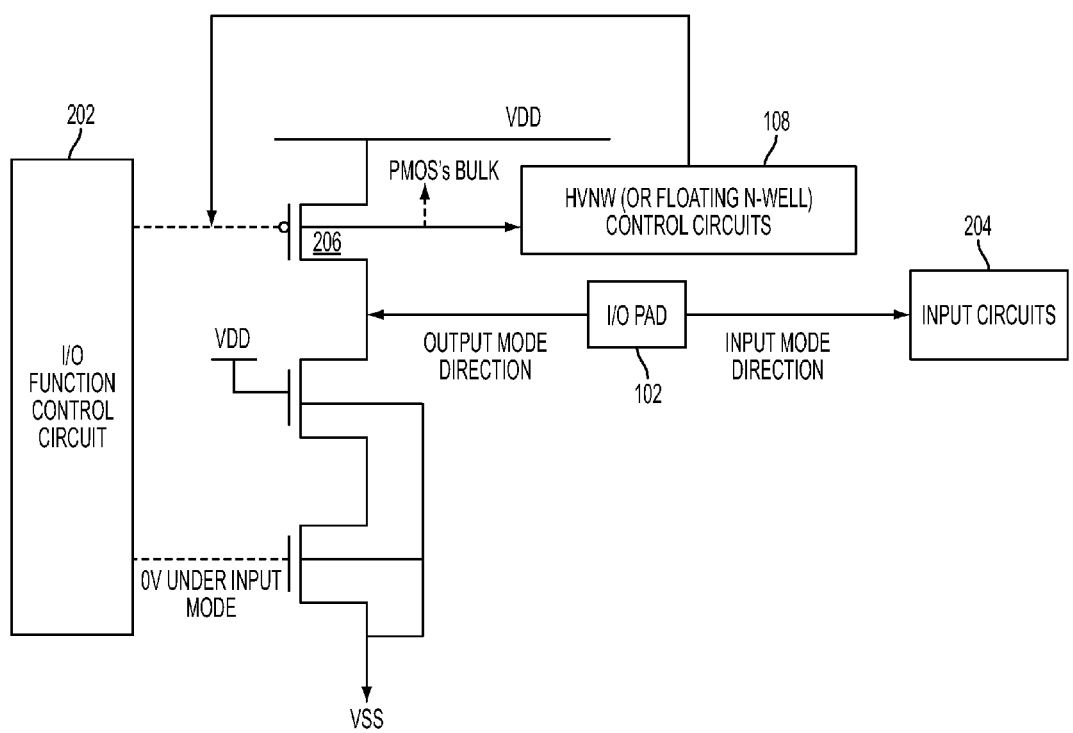
FIG. 2 illustrates a block diagram including HVNW control circuits for latch-up prevention according to an embodiment.

FIG. 2 illustrates a block diagram including HVNW control circuits for latch-up prevention method according to an embodiment. The I/O pad 102 is connected to input circuits 204 for input operation, and the I/O function control circuit 202 manages the input and output functions. The HVNW (or floating NW) control circuit 108 feeds VDD to the bulk and gate of the I/O PMOS driver 206 (or HVNW 106), so that there is no leakage from I/O pad 102 to VDD under normal input mode (0 V~VDD). The function of I/O PMOS driver is to provide high driving capability (IOH) and logic high level (VOH). Also, this HVNW control circuit 108 will feed a voltage greater than VDD to the bulk and gate of the I/O PMOS driver 206, so that there is no leakage between the I/O pad 102 to VDD under high voltage tolerant input mode (0 V~>VDD).

Figure 3:
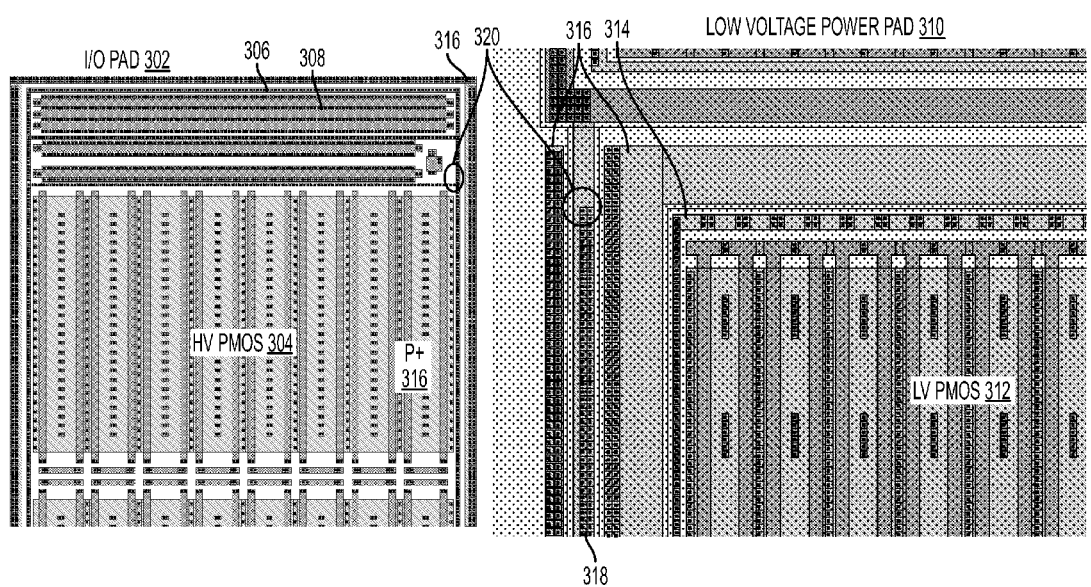
FIG. 3 illustrates an exemplary layout for latch-up prevention according to an embodiment.

FIG. 3 illustrates an exemplary layout for latch-up prevention according to one embodiment. The I/O pad 302 is shown, along with the HVNW (floating NW) 306, HVNW control circuit 308, high-voltage (HV) PMOS 304, P+ 316, low voltage power pad 310, low-voltage PMOS 312, LVNW 314, guard-ring HVNW 318, and signal metal connection 320 that connects the guard ring HVNW 318 with the floating NW 306 (the bulk of I/O PMOS driver 206). The guard-ring HVNW 318 surrounds LVNW 314 in low voltage power pad 310 and the HVNW control circuit 308 controls the HVNW 318 voltage level. Because the voltage level of guard-ring HVNW 318 in low voltage power pad 310 is matched by floating NW 306 through the signal metal connection 320, there is no voltage drop between the HVNW 306 and guard-ring HVNW 318, and thus it prevents forming a latch-up path from HVNW 306 to LVNW 314.

By using the structure and method described above, the I/O pad 302 can be placed adjacent to the low voltage pad 310 using process minimum rule without latch-up risk from HVNW 306 to LVNW 314, and valuable real estate is saved when compared to a layout that needs 30 μm latch-up spacing in between them. Therefore, the advantageous features of the disclosed embodiments include latch-up prevention from P+ in NW (high voltage) to N+ in NW (low voltage) and small I/O LIBRARY area by not requiring latch-up path spacing (e.g. at least 30 μm), especially in HVT I/O cells (e.g., 3.3 V or 5.5 V). A skilled person in the art will appreciate that there can be many embodiment variations of this invention.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit, comprising:
   an input and/or output pad;
   a HVNW control circuit electrically coupled to a first voltage supply;
   a floating high-voltage n-well (HVNW) connected to the input and/or output pad through a P+ in the floating HVNW and to the HVNW control circuit through an N+ in the floating HVNW;
   a low-voltage n-well (LVNW) connected to a second voltage supply through an N+ in the LVNW, a voltage level of the second voltage supply is lower than that of the first voltage supply; and
   a guard-ring HVNW disposed between the floating HVNW and the LVNW and electrically coupled to the HVNW control circuit, the HVNW control circuit being configured to control the guard-ring HVNW's voltage level.

2. The integrated circuit of claim 1, wherein the guard-ring HVNW's voltage level is matched by the floating HVNW's voltage level.

3. The integrated circuit of claim 1, wherein the HVNW control circuit is connected to a bulk and a gate of an I/O PMOS driver and the bulk of the I/O PMOS driver is also the floating HVNW.

4. The integrated circuit of claim 3, wherein the HVNW control circuit is configured to feed the first voltage supply's voltage level to the bulk and the gate of the I/O PMOS driver.

5. The integrated circuit of claim 4, wherein the HVNW control circuit is configured to feed a voltage level higher than the first voltage supply's voltage level to the bulk and the gate of the I/O PMOS driver when an input and/or output has a voltage level higher than the first voltage supply's voltage level.

6. The integrated circuit of claim 1, wherein the input and/or output pad is adjacent to a low voltage power pad that includes the LVNW, using a process minimum rule.

7. The integrated circuit of claim 1, wherein p-wells connected to VSS through P+ in the p-wells are adjacent to both sides of the guard-ring HVNW.

8. The integrated circuit of claim 1, wherein the first voltage supply has 3.3V or 5V voltage level.

9. The integrated circuit of claim 1, wherein the first voltage supply has 2.5V or 3.3V voltage level.

10. The integrated circuit of claim 1, wherein the second voltage supply has 1.2V voltage level.

11. An integrated circuit, comprising:
an input and/or output pad;
a HVNW control circuit electrically coupled to a first voltage supply;
a floating high-voltage n-well (HVNW) connected to the input and/or output pad through a P+ in the floating HVNW and to the HVNW control circuit through an N+ in the floating HVNW;
a low-voltage n-well (LVNW) connected to a second voltage supply through an N+ in the LVNW; and
a guard-ring HVNW electrically coupled to the HVNW control circuit;
wherein the first voltage supply has higher voltage level than the second voltage supply, the guard-ring HVNW is inserted in between the floating HVNW and LVNW to prevent a latch-up path between the P+ in the floating HVNW and the N+ in the LVNW by using the HVNW control circuit that controls the guard-ring HVNW's voltage level that is matched by the floating HVNW's voltage level.

12. The integrated circuit of claim 11, wherein the HVNW control circuit is connected to a bulk and a gate of an I/O PMOS driver and the bulk of the I/O PMOS driver is also the floating HVNW.

13. The integrated circuit of claim 12, wherein the HVNW control circuit is configured to feed the first voltage supply's voltage level to the bulk and the gate of the I/O PMOS driver.

14. The integrated circuit of claim 13, wherein the HVNW control circuit is configured to feed a voltage level higher than the first voltage supply's voltage level to the bulk and the gate of the I/O PMOS driver when an input and/or output has a voltage level higher than the first voltage supply's voltage level.

15. The integrated circuit of claim 11, wherein the input and/or output pad is adjacent to a low voltage power pad that includes the LVNW, using process minimum rule.

16. The integrated circuit of claim 11, wherein p-wells connected to VSS through P+ in the p-wells are adjacent to both sides of the guard-ring HVNW.

17. An integrated circuit, comprising:
an input and/or output pad;
a floating high-voltage n-well (HVNW) connected to the input and/or output pad through a P+ in the floating HVNW and also connected to a first voltage supply;
a low-voltage n-well (LVNW) connected to a second voltage supply through a N+ in the LVNW;
a HVNW control circuit; and
a guard-ring HVNW;
wherein the first voltage supply has higher voltage level than the second voltage supply, guard-ring HVNW is inserted in between the floating HVNW and LVNW to prevent a latch-up path between a P+ in HVNW and N+ in LVNW by using the HVNW control circuit that controls the guard-ring HVNW's voltage level that is matched by the floating HVNW's voltage level, the HVNW control circuit is connected to a bulk and a gate of an I/O PMOS driver, and the bulk of the I/O PMOS driver is also the floating HVNW.

18. The integrated circuit of claim 17, wherein the HVNW control circuit is configured to feed the first voltage supply's voltage level to the bulk and the gate of the I/O PMOS driver.

19. The integrated circuit of claim 17, wherein the HVNW control circuit is configured to feed a voltage level higher than the first voltage supply's voltage level to the bulk and the gate of the I/O PMOS driver when an input and/or output has a voltage level higher than the first voltage supply's voltage level.

20. The integrated circuit of claim 17, wherein the input and/or output pad is adjacent to a low voltage power pad that includes the LVNW, using process minimum rule.

* * * * *